United States Patent
Pinkovich et al.

(10) Patent No.: US 9,368,225 B1
(45) Date of Patent: Jun. 14, 2016

(54) DETERMINING READ THRESHOLDS BASED UPON READ ERROR DIRECTION STATISTICS

(71) Applicant: DENSBITS TECHNOLOGIES LTD., Haifa (IL)

(72) Inventors: Evgeni Pinkovich, Nesher (IL); Hanan Weingarten, Hertzelia (IL)

(73) Assignee: AVAGO TECHNOLOGIES GENERAL IP (SINGAPORE) PTE. LTD., Yishun (SG)

( * ) Notice: Subject to any disclaimer, the term of this patent is extended or adjusted under 35 U.S.C. 154(b) by 740 days.

(21) Appl. No.: 13/683,479

(22) Filed: Nov. 21, 2012

(51) Int. Cl.
| | | |
|---|---|---|
| G11C 11/34 | (2006.01) |
| G11C 16/04 | (2006.01) |
| G11C 16/34 | (2006.01) |
| G11C 7/06 | (2006.01) |
| G11C 16/26 | (2006.01) |

(52) U.S. Cl.
CPC ............... *G11C 16/34* (2013.01); *G11C 7/065* (2013.01); *G11C 16/26* (2013.01)

(58) Field of Classification Search
CPC ......... G11C 16/34; G11C 16/26; G11C 7/065
USPC .............. 365/185.03, 185.11, 185.25, 185.21
See application file for complete search history.

(56) References Cited

U.S. PATENT DOCUMENTS

| 4,430,701 A | 2/1984 | Christian et al. |
|---|---|---|
| 4,463,375 A | 7/1984 | Macovski |
| 4,584,686 A | 4/1986 | Fritze |
| 4,589,084 A | 5/1986 | Fling et al. |
| 4,777,589 A | 10/1988 | Boettner et al. |
| 4,866,716 A | 9/1989 | Weng |
| 5,003,597 A | 3/1991 | Merkle |
| 5,077,737 A | 12/1991 | Leger et al. |
| 5,297,153 A | 3/1994 | Baggen et al. |
| 5,305,276 A | 4/1994 | Uenoyama |
| 5,592,641 A | 1/1997 | Doyle et al. |
| 5,623,620 A | 4/1997 | Alexis et al. |
| 5,640,529 A | 6/1997 | Hasbun |
| 5,657,332 A | 8/1997 | Auclair et al. |
| 5,663,901 A | 9/1997 | Harari et al. |
| 5,724,538 A | 3/1998 | Bryg |
| 5,729,490 A | 3/1998 | Calligaro et al. |
| 5,740,395 A | 4/1998 | Hasbun |
| 5,745,418 A | 4/1998 | Hu et al. |
| 5,778,430 A | 7/1998 | Giovannetti |

(Continued)

OTHER PUBLICATIONS

Search Report of PCT Patent Application WO 2009/118720 A3, Mar. 4, 2010.

(Continued)

*Primary Examiner* — Toan Le
(74) *Attorney, Agent, or Firm* — Reches Patents

(57) ABSTRACT

There is provided a method for setting read thresholds to be used for reading multiple bits per cell flash memory cells, the method may include reading, by a read circuit, the flash memory cells using a set of current read thresholds to provide current read results; finding, by an error evaluation circuit, current read errors direction statistics associated with the current read results; determining multiple read threshold changes based upon the current read error direction statistics, without determining a contribution of each current read threshold to the current read error direction statistics; and altering multiple current read thresholds, by the multiple read threshold updates, to provide a set of next read thresholds.

35 Claims, 8 Drawing Sheets

(56) References Cited

U.S. PATENT DOCUMENTS

| | | |
|---|---|---|
| 5,793,774 A | 8/1998 | Usui et al. |
| 5,920,578 A | 7/1999 | Zook et al. |
| 5,926,409 A | 7/1999 | Engh et al. |
| 5,933,368 A | 8/1999 | Hu et al. |
| 5,956,268 A | 9/1999 | Lee |
| 5,956,473 A | 9/1999 | Hu et al. |
| 5,968,198 A | 10/1999 | Balachandran |
| 5,982,659 A | 11/1999 | Irrinki et al. |
| 6,011,741 A | 1/2000 | Harari et al. |
| 6,016,275 A | 1/2000 | Han |
| 6,038,634 A | 3/2000 | Ji et al. |
| 6,081,878 A | 6/2000 | Estakhri |
| 6,094,465 A | 7/2000 | Stein et al. |
| 6,119,245 A | 9/2000 | Hiratsuka |
| 6,182,261 B1 | 1/2001 | Haller et al. |
| 6,192,497 B1 | 2/2001 | Yang et al. |
| 6,195,287 B1 | 2/2001 | Hirano |
| 6,199,188 B1 | 3/2001 | Shen et al. |
| 6,209,114 B1 | 3/2001 | Wolf et al. |
| 6,259,627 B1 | 7/2001 | Wong |
| 6,272,052 B1 | 8/2001 | Miyauchi |
| 6,278,633 B1 | 8/2001 | Wong et al. |
| 6,279,133 B1 | 8/2001 | Vafai et al. |
| 6,301,151 B1 | 10/2001 | Engh et al. |
| 6,370,061 B1 | 4/2002 | Yachareni et al. |
| 6,374,383 B1 | 4/2002 | Weng |
| 6,504,891 B1 | 1/2003 | Chevallier |
| 6,532,169 B1 | 3/2003 | Mann et al. |
| 6,532,556 B1 | 3/2003 | Wong et al. |
| 6,553,533 B2 | 4/2003 | Demura et al. |
| 6,560,747 B1 | 5/2003 | Weng |
| 6,637,002 B1 | 10/2003 | Weng et al. |
| 6,639,865 B2 | 10/2003 | Kwon |
| 6,674,665 B1 | 1/2004 | Mann et al. |
| 6,675,281 B1 | 1/2004 | Oh |
| 6,704,902 B1 | 3/2004 | Shinbashi et al. |
| 6,751,766 B2 | 6/2004 | Guterman et al. |
| 6,772,274 B1 | 8/2004 | Estakhri |
| 6,781,910 B2 | 8/2004 | Smith |
| 6,792,569 B2 | 9/2004 | Cox et al. |
| 6,873,543 B2 | 3/2005 | Smith et al. |
| 6,891,768 B2 | 5/2005 | Smith et al. |
| 6,914,809 B2 | 7/2005 | Hilton et al. |
| 6,915,477 B2 | 7/2005 | Gollamudi et al. |
| 6,952,365 B2 | 10/2005 | Gonzalez et al. |
| 6,961,890 B2 | 11/2005 | Smith |
| 6,968,421 B2 | 11/2005 | Conley |
| 6,990,012 B2 | 1/2006 | Smith et al. |
| 6,996,004 B1 | 2/2006 | Fastow et al. |
| 6,999,854 B2 | 2/2006 | Roth |
| 7,010,739 B1 | 3/2006 | Feng et al. |
| 7,012,835 B2 | 3/2006 | Gonzalez et al. |
| 7,038,950 B1 | 5/2006 | Hamilton et al. |
| 7,068,539 B2 | 6/2006 | Guterman et al. |
| 7,079,436 B2 | 7/2006 | Perner et al. |
| 7,149,950 B2 | 12/2006 | Spencer et al. |
| 7,177,977 B2 | 2/2007 | Chen et al. |
| 7,188,228 B1 | 3/2007 | Chang et al. |
| 7,191,379 B2 | 3/2007 | Adelmann et al. |
| 7,196,946 B2 | 3/2007 | Chen et al. |
| 7,203,874 B2 | 4/2007 | Roohparvar |
| 7,212,426 B2 | 5/2007 | Park |
| 7,290,203 B2 | 10/2007 | Emma et al. |
| 7,292,365 B2 | 11/2007 | Knox |
| 7,301,928 B2 | 11/2007 | Nakabayashi et al. |
| 7,315,916 B2 | 1/2008 | Bennett |
| 7,388,781 B2 | 6/2008 | Litsyn |
| 7,395,404 B2 | 7/2008 | Gorobets |
| 7,441,067 B2 | 10/2008 | Gorobets et al. |
| 7,443,729 B2 | 10/2008 | Li |
| 7,450,425 B2 | 11/2008 | Aritome |
| 7,454,670 B2 | 11/2008 | Kim et al. |
| 7,466,575 B2 | 12/2008 | Shalvi et al. |
| 7,533,328 B2 | 5/2009 | Alrod et al. |
| 7,558,109 B2 | 7/2009 | Brandman et al. |
| 7,593,263 B2 | 9/2009 | Sokolov et al. |
| 7,610,433 B2 | 10/2009 | Randell et al. |
| 7,613,043 B2 | 11/2009 | Cornwell |
| 7,619,922 B2 | 11/2009 | Li |
| 7,697,326 B2 | 4/2010 | Sommer et al. |
| 7,706,182 B2 | 4/2010 | Shalvi et al. |
| 7,716,538 B2 | 5/2010 | Gonzalez |
| 7,804,718 B2 | 9/2010 | Kim |
| 7,805,663 B2 | 9/2010 | Brandman et al. |
| 7,805,664 B1 | 9/2010 | Yang et al. |
| 7,844,877 B2 | 11/2010 | Litsyn et al. |
| 7,911,848 B2 | 3/2011 | Eun |
| 7,961,797 B1 | 6/2011 | Yang et al. |
| 7,975,192 B2 | 7/2011 | Sommer |
| 8,020,073 B2 | 9/2011 | Emma et al. |
| 8,108,590 B2 | 1/2012 | Chow et al. |
| 8,122,328 B2 | 2/2012 | Liu et al. |
| 8,159,881 B2 | 4/2012 | Yang |
| 8,190,961 B1 | 5/2012 | Yang |
| 8,250,324 B2 | 8/2012 | Haas |
| 8,300,823 B2 | 10/2012 | Bojinov |
| 8,305,812 B2 | 11/2012 | Levy |
| 8,327,246 B2 | 12/2012 | Weingarten |
| 8,407,560 B2 | 3/2013 | Ordentlich |
| 8,417,893 B2 | 4/2013 | Khmelnitsky |
| 2001/0034815 A1 | 10/2001 | Dugan et al. |
| 2002/0063774 A1 | 5/2002 | Hillis et al. |
| 2002/0085419 A1 | 7/2002 | Choi |
| 2002/0154769 A1 | 10/2002 | Petersen et al. |
| 2002/0156988 A1 | 10/2002 | Sekibe |
| 2002/0174156 A1 | 11/2002 | Birru |
| 2003/0014582 A1 | 1/2003 | Nakanishi |
| 2003/0065876 A1 | 4/2003 | Lasser |
| 2003/0101404 A1 | 5/2003 | Zhao et al. |
| 2003/0105620 A1 | 6/2003 | Bowen |
| 2003/0177300 A1 | 9/2003 | Jeong |
| 2003/0192007 A1 | 10/2003 | Miller et al. |
| 2004/0015771 A1 | 1/2004 | Lasser et al. |
| 2004/0030971 A1 | 2/2004 | Shibata |
| 2004/0059768 A1 | 3/2004 | Denk |
| 2004/0080985 A1 | 4/2004 | Chang et al. |
| 2004/0153722 A1 | 8/2004 | Lee |
| 2004/0153817 A1 | 8/2004 | Chevallier |
| 2004/0181735 A1 | 9/2004 | Xin |
| 2004/0203591 A1 | 10/2004 | Lee |
| 2004/0210706 A1 | 10/2004 | In et al. |
| 2005/0013165 A1 | 1/2005 | Ban |
| 2005/0018482 A1 | 1/2005 | Cemea et al. |
| 2005/0083735 A1 | 4/2005 | Chen et al. |
| 2005/0117401 A1 | 6/2005 | Chen et al. |
| 2005/0120265 A1 | 6/2005 | Pline et al. |
| 2005/0128811 A1 | 6/2005 | Kato et al. |
| 2005/0138533 A1 | 6/2005 | Le-Bars et al. |
| 2005/0144213 A1 | 6/2005 | Simkins et al. |
| 2005/0144368 A1 | 6/2005 | Chung et al. |
| 2005/0169057 A1 | 8/2005 | Shibata |
| 2005/0172179 A1 | 8/2005 | Brandenberger et al. |
| 2005/0213393 A1 | 9/2005 | Lasser |
| 2005/0243626 A1 | 11/2005 | Ronen |
| 2006/0059406 A1 | 3/2006 | Micheloni et al. |
| 2006/0059409 A1 | 3/2006 | Lee |
| 2006/0064537 A1 | 3/2006 | Oshima |
| 2006/0101193 A1 | 5/2006 | Murin |
| 2006/0195651 A1 | 8/2006 | Estakhri |
| 2006/0203587 A1 | 9/2006 | Li et al. |
| 2006/0221692 A1 | 10/2006 | Chen |
| 2006/0248434 A1 | 11/2006 | Radke et al. |
| 2006/0268608 A1 | 11/2006 | Noguchi et al. |
| 2006/0282411 A1 | 12/2006 | Fagin et al. |
| 2006/0284244 A1 | 12/2006 | Forbes |
| 2006/0294312 A1 | 12/2006 | Walmsley |
| 2007/0025157 A1 | 2/2007 | Wan et al. |
| 2007/0063180 A1 | 3/2007 | Asano et al. |
| 2007/0081388 A1 | 4/2007 | Joo |
| 2007/0098069 A1 | 5/2007 | Gordon |
| 2007/0103992 A1 | 5/2007 | Sakui et al. |
| 2007/0104004 A1 | 5/2007 | So et al. |
| 2007/0109858 A1 | 5/2007 | Conley et al. |
| 2007/0124652 A1 | 5/2007 | Litsyn et al. |

(56) References Cited

U.S. PATENT DOCUMENTS

| | | |
|---|---|---|
| 2007/0140006 A1 | 6/2007 | Chen |
| 2007/0143561 A1 | 6/2007 | Gorobets |
| 2007/0150694 A1 | 6/2007 | Chang et al. |
| 2007/0168625 A1 | 7/2007 | Cornwell et al. |
| 2007/0171714 A1 | 7/2007 | Wu et al. |
| 2007/0171730 A1 | 7/2007 | Ramamoorthy et al. |
| 2007/0180346 A1 | 8/2007 | Murin |
| 2007/0223277 A1 | 9/2007 | Tanaka et al. |
| 2007/0226582 A1 | 9/2007 | Tang et al. |
| 2007/0226592 A1 | 9/2007 | Radke |
| 2007/0228449 A1 | 10/2007 | Takano et al. |
| 2007/0253249 A1 | 11/2007 | Kang et al. |
| 2007/0253250 A1 | 11/2007 | Shibata |
| 2007/0263439 A1 | 11/2007 | Cornwell et al. |
| 2007/0266291 A1 | 11/2007 | Toda et al. |
| 2007/0271494 A1 | 11/2007 | Gorobets |
| 2007/0297226 A1 | 12/2007 | Mokhlesi |
| 2008/0010581 A1 | 1/2008 | Alrod et al. |
| 2008/0028014 A1 | 1/2008 | Hilt et al. |
| 2008/0049497 A1 | 2/2008 | Mo |
| 2008/0055989 A1 | 3/2008 | Lee |
| 2008/0082897 A1 | 4/2008 | Brandman et al. |
| 2008/0092026 A1 | 4/2008 | Brandman et al. |
| 2008/0104309 A1 | 5/2008 | Cheon et al. |
| 2008/0112238 A1 | 5/2008 | Kim |
| 2008/0116509 A1 | 5/2008 | Harari et al. |
| 2008/0126686 A1 | 5/2008 | Sokolov et al. |
| 2008/0127104 A1 | 5/2008 | Li |
| 2008/0128790 A1 | 6/2008 | Jung |
| 2008/0130341 A1 | 6/2008 | Shalvi et al. |
| 2008/0137413 A1 | 6/2008 | Kong et al. |
| 2008/0137414 A1 | 6/2008 | Park et al. |
| 2008/0141043 A1 | 6/2008 | Flynn et al. |
| 2008/0148115 A1 | 6/2008 | Sokolov |
| 2008/0158958 A1 | 7/2008 | Shalvi et al. |
| 2008/0159059 A1 | 7/2008 | Moyer |
| 2008/0162079 A1 | 7/2008 | Astigarraga et al. |
| 2008/0168216 A1 | 7/2008 | Lee |
| 2008/0168320 A1 | 7/2008 | Cassuto et al. |
| 2008/0181001 A1 | 7/2008 | Shalvi |
| 2008/0198650 A1 | 8/2008 | Shalvi et al. |
| 2008/0198652 A1 | 8/2008 | Shalvi et al. |
| 2008/0201620 A1 | 8/2008 | Gollub |
| 2008/0209114 A1 | 8/2008 | Chow et al. |
| 2008/0219050 A1 | 9/2008 | Shalvi et al. |
| 2008/0225599 A1 | 9/2008 | Chae |
| 2008/0250195 A1 | 10/2008 | Chow et al. |
| 2008/0263262 A1 | 10/2008 | Sokolov et al. |
| 2008/0282106 A1 | 11/2008 | Shalvi et al. |
| 2008/0285351 A1 | 11/2008 | Shlick et al. |
| 2008/0301532 A1 | 12/2008 | Uchikawa et al. |
| 2009/0024905 A1 | 1/2009 | Shalvi et al. |
| 2009/0027961 A1 | 1/2009 | Park |
| 2009/0043951 A1 | 2/2009 | Shalvi et al. |
| 2009/0046507 A1 | 2/2009 | Aritome |
| 2009/0072303 A9 | 3/2009 | Prall et al. |
| 2009/0091979 A1 | 4/2009 | Shalvi |
| 2009/0103358 A1 | 4/2009 | Sommer et al. |
| 2009/0106485 A1 | 4/2009 | Anholt |
| 2009/0113275 A1 | 4/2009 | Chen et al. |
| 2009/0125671 A1 | 5/2009 | Flynn |
| 2009/0132755 A1 | 5/2009 | Radke |
| 2009/0144598 A1 | 6/2009 | Yoon |
| 2009/0144600 A1 | 6/2009 | Perlmutter et al. |
| 2009/0150599 A1 | 6/2009 | Bennett |
| 2009/0150748 A1 | 6/2009 | Egner et al. |
| 2009/0157964 A1 | 6/2009 | Kasorla et al. |
| 2009/0158126 A1 | 6/2009 | Perlmutter et al. |
| 2009/0168524 A1 | 7/2009 | Golov et al. |
| 2009/0187803 A1 | 7/2009 | Anholt et al. |
| 2009/0199074 A1 | 8/2009 | Sommer |
| 2009/0213653 A1 | 8/2009 | Perlmutter et al. |
| 2009/0213654 A1 | 8/2009 | Perlmutter et al. |
| 2009/0228761 A1 | 9/2009 | Perlmutter et al. |
| 2009/0240872 A1 | 9/2009 | Perlmutter et al. |
| 2009/0282185 A1 | 11/2009 | Van Cauwenbergh |
| 2009/0282186 A1 | 11/2009 | Mokhlesi |
| 2009/0287930 A1 | 11/2009 | Nagaraja |
| 2009/0300269 A1 | 12/2009 | Radke et al. |
| 2009/0323942 A1 | 12/2009 | Sharon |
| 2010/0005270 A1 | 1/2010 | Jiang |
| 2010/0025811 A1 | 2/2010 | Bronner et al. |
| 2010/0030944 A1 | 2/2010 | Hinz |
| 2010/0058146 A1 | 3/2010 | Weingarten et al. |
| 2010/0064096 A1 | 3/2010 | Weingarten et al. |
| 2010/0088557 A1 | 4/2010 | Weingarten et al. |
| 2010/0091535 A1* | 4/2010 | Sommer et al. ............. 365/45 |
| 2010/0095186 A1 | 4/2010 | Weingarten |
| 2010/0110787 A1 | 5/2010 | Shalvi et al. |
| 2010/0115376 A1 | 5/2010 | Shalvi et al. |
| 2010/0122113 A1 | 5/2010 | Weingarten et al. |
| 2010/0124088 A1 | 5/2010 | Shalvi et al. |
| 2010/0131580 A1 | 5/2010 | Kanter et al. |
| 2010/0131806 A1 | 5/2010 | Weingarten et al. |
| 2010/0131809 A1 | 5/2010 | Katz |
| 2010/0131826 A1 | 5/2010 | Shalvi et al. |
| 2010/0131827 A1 | 5/2010 | Sokolov et al. |
| 2010/0131831 A1 | 5/2010 | Weingarten et al. |
| 2010/0146191 A1 | 6/2010 | Katz |
| 2010/0146192 A1 | 6/2010 | Weingarten et al. |
| 2010/0149881 A1 | 6/2010 | Lee et al. |
| 2010/0172179 A1 | 7/2010 | Gorobets et al. |
| 2010/0174853 A1 | 7/2010 | Lee |
| 2010/0180073 A1 | 7/2010 | Weingarten et al. |
| 2010/0199149 A1 | 8/2010 | Weingarten et al. |
| 2010/0211724 A1 | 8/2010 | Weingarten |
| 2010/0211833 A1 | 8/2010 | Weingarten |
| 2010/0211856 A1 | 8/2010 | Weingarten |
| 2010/0241793 A1 | 9/2010 | Sugimoto |
| 2010/0246265 A1 | 9/2010 | Moschiano et al. |
| 2010/0251066 A1 | 9/2010 | Radke |
| 2010/0253555 A1 | 10/2010 | Weingarten et al. |
| 2010/0257309 A1 | 10/2010 | Barsky et al. |
| 2010/0269008 A1 | 10/2010 | Leggette |
| 2010/0293321 A1 | 11/2010 | Weingarten |
| 2010/0318724 A1 | 12/2010 | Yeh |
| 2011/0051521 A1 | 3/2011 | Levy et al. |
| 2011/0055461 A1 | 3/2011 | Steiner et al. |
| 2011/0093650 A1 | 4/2011 | Kwon et al. |
| 2011/0096612 A1 | 4/2011 | Steiner et al. |
| 2011/0099460 A1 | 4/2011 | Dusija et al. |
| 2011/0119562 A1 | 5/2011 | Steiner et al. |
| 2011/0153919 A1 | 6/2011 | Sabbag |
| 2011/0161775 A1 | 6/2011 | Weingarten |
| 2011/0194353 A1 | 8/2011 | Hwang |
| 2011/0209028 A1 | 8/2011 | Post |
| 2011/0214029 A1 | 9/2011 | Steiner et al. |
| 2011/0214039 A1 | 9/2011 | Steiner et al. |
| 2011/0246792 A1 | 10/2011 | Weingarten |
| 2011/0246852 A1 | 10/2011 | Sabbag |
| 2011/0252187 A1 | 10/2011 | Segal et al. |
| 2011/0252188 A1 | 10/2011 | Weingarten |
| 2011/0271043 A1 | 11/2011 | Segal et al. |
| 2011/0302428 A1 | 12/2011 | Weingarten |
| 2012/0001778 A1 | 1/2012 | Steiner et al. |
| 2012/0005554 A1 | 1/2012 | Steiner et al. |
| 2012/0005558 A1 | 1/2012 | Steiner et al. |
| 2012/0005560 A1 | 1/2012 | Steiner et al. |
| 2012/0008401 A1 | 1/2012 | Katz et al. |
| 2012/0008414 A1 | 1/2012 | Katz et al. |
| 2012/0017136 A1 | 1/2012 | Ordentlich et al. |
| 2012/0051144 A1 | 3/2012 | Weingarten et al. |
| 2012/0063227 A1* | 3/2012 | Weingarten et al. ..... 365/185.09 |
| 2012/0066441 A1 | 3/2012 | Weingarten |
| 2012/0110250 A1 | 5/2012 | Sabbag et al. |
| 2012/0124273 A1 | 5/2012 | Goss et al. |
| 2012/0246391 A1 | 9/2012 | Meir |
| 2013/0045045 A1* | 2/2013 | Quan et al. ................. 403/327 |
| 2014/0056066 A1* | 2/2014 | Baum et al. .............. 365/185.03 |

OTHER PUBLICATIONS

Search Report of PCT Patent Application WO 2009/095902 A3, Mar. 4, 2010.

(56) References Cited

OTHER PUBLICATIONS

Search Report of PCT Patent Application WO 2009/078006 A3, Mar. 4, 2010.
Search Report of PCT Patent Application WO 2009/074979 A3, Mar. 4, 2010.
Search Report of PCT Patent Application WO 2009/074978 A3, Mar. 4, 2010.
Search Report of PCT Patent Application WO 2009/072105 A3, Mar. 4, 2010.
Search Report of PCT Patent Application WO 2009/072104 A3, Mar. 4, 2010.
Search Report of PCT Patent Application WO 2009/072103 A3, Mar. 4, 2010.
Search Report of PCT Patent Application WO 2009/072102 A3, Mar. 4, 2010.
Search Report of PCT Patent Application WO 2009/072101 A3, Mar. 4, 2010.
Search Report of PCT Patent Application WO 2009/072100 A3, Mar. 4, 2010.
Search Report of PCT Patent Application WO 2009/053963 A3, Mar. 4, 2010.
Search Report of PCT Patent Application WO 2009/053962 A3, Mar. 4, 2010.
Search Report of PCT Patent Application WO 2009/053961 A3, Mar. 4, 2010.
Search Report of PCT Patent Application WO 2009/037697 A3, Mar. 4, 2010.
Yani Chen, Keshab K. Parhi, "Small Area Parallel Chien Search Architectures for Long BCH Codes", Ieee Transactions on Very Large Scale Integration(VLSI) Systems, vol. 12, No. 5, May 2004.
Yuejian Wu, "Low Power Decoding of BCH Codes", Nortel Networks, Ottawa, Ont., Canada, in Circuits and systems, 2004. ISCAS '04. Proceeding of the 2004 International Symposium on Circuits and Systems, published May 23-26, 2004, vol. 2, pp. II-369-II-372 vol. 2.
Michael Purser, "Introduction to Error Correcting Codes", Artech House Inc., 1995.
Ron M. Roth, "Introduction to Coding Theory", Cambridge University Press, 2006.
Akash Kumar, Sergei Sawitzki, "High-Throughput and Low Power Architectures for Reed Solomon Decoder", (a.kumar at tue.nl, Eindhoven University of Technology and sergei.sawitzki at philips.com), Oct. 2005.
Todd K.Moon, "Error Correction Coding Mathematical Methods and Algorithms", A John Wiley & Sons, Inc., 2005.
Richard E. Blahut, "Algebraic Codes for Data Transmission", Cambridge University Press, 2003.
David Esseni, Bruno Ricco, "Trading-Off Programming Speed and Current Absorption in Flash Memories with the Ramped-Gate Programming Technique", Ieee Transactions on Electron Devices, vol. 47, No. 4, Apr. 2000.
Giovanni Campardo, Rino Micheloni, David Novosel, "VLSI-Design of Non-Volatile Memories", Springer Berlin Heidelberg New York, 2005.
John G. Proakis, "Digital Communications", 3rd ed., New York: McGraw-Hill, 1995.
J.M. Portal, H. Aziza, D. Nee, "EEPROM Memory: Threshold Voltage Built in Self Diagnosis", ITC International Test Conference, Paper 2.1, Feb. 2005.
J.M. Portal, H. Aziza, D. Nee, "EEPROM Diagnosis Based on Threshold Voltage Embedded Measurement", Journal of Electronic Testing: Theory and Applications 21, 33-42, 2005.
G. Tao, A. Scarpa, J. Dijkstra, W. Stidl, F. Kuper, "Data retention prediction for modern floating gate non-volatile memories", Microelectronics Reliability 40 (2000), 1561-1566.
T. Hirneno, N. Matsukawa, H. Hazama, K. Sakui, M. Oshikiri, K. Masuda, K. Kanda, Y. Itoh, J. Miyamoto, "A New Technique for Measuring Threshold Voltage Distribution in Flash EEPROM Devices", Proc. IEEE 1995 Int. Conference on Microelectronics Test Structures, vol. 8, Mar. 1995.
Boaz Eitan, Guy Cohen, Assaf Shappir, Eli Lusky, Amichai Givant, Meir Janai, Ilan Bloom, Yan Polansky, Oleg Dadashev, Avi Lavan, Ran Sahar, Eduardo Maayan, "4-bit per Cell NROM Reliability", Appears on the website of Saifun.com, 2005.
Paulo Cappelletti, Clara Golla, Piero Olivo, Enrico Zanoni, "Flash Memories", Kluwer Academic Publishers, 1999.
JEDEC Standard, "Stress-Test-Driven Qualification of Integrated Circuits", JEDEC Solid State Technology Association. JEDEC Standard No. 47F pp. 1-26, Dec. 2007.
Dempster, et al., "Maximum Likelihood from Incomplete Data via the EM Algorithm", Journal of the Royal Statistical Society. Series B (Methodological), vol. 39, No. 1 (1997), pp. 1-38.
Mielke, et al., "Flash EEPROM Threshold Instabilities due to Charge Trapping During Program/Erase Cycling", IEEE Transactions on Device and Materials Reliability, vol. 4, No. 3, Sep. 2004, pp. 335-344.
Daneshbeh, "Bit Serial Systolic Architectures for Multiplicative Inversion and Division over GF (2)", A thesis presented to the University of Waterloo, Ontario, Canada, 2005, pp. 1-118.
Chen, Formulas for the solutions of Quadratic Equations over GF (2), IEEE Trans. Inform. Theory, vol. IT-28, No. 5, Sep. 1982, pp. 792-794.
Berlekamp et al., "On the Solution of Algebraic Equations over Finite Fields", Inform. Cont. 10, Oct. 1967, pp. 553-564.

\* cited by examiner

| |
|---|
| Determining, for each current read threshold a read threshold change. 530(1) |
| Determining a read threshold change associated with a current read threshold in response to a value of the current read threshold and in response to the current read errors direction statistics, wherein the current read errors direction statistics comprise a number of current read errors along a first direction and a number of current read errors along an second direction opposite to the first direction. 530(2) |
| Calculating a read threshold change as a linear combination of the value of the current read threshold, the number of current read errors along the first direction and the number of current read errors along the second direction. 530(3) |
| Determining of the multiple read threshold changes in response to at least one physical characteristic of the flash memory cells. 530(4) |
| Finding a maximal margin estimator to the set of next read thresholds. 530(5) |
| Finding of the maximal margin estimator by finding a minimum of an square absolute value of a difference between (i) a first vector of a set of optimal read thresholds, and (ii) a second vector that equals a multiplication of a read threshold and error matrix by a set of multiple read threshold changes; wherein the read threshold and error matrix may include multiple rows, each row may include a set of read thresholds applied during a read attempt of the group of flash memory cells and read error direction statistics associated with the read attempt. 530(6) |
| Finding the maximal margin estimator by finding minimal and maximal sets of multiple read threshold changes that are associated with read error numbers that are amendable by the error evaluation circuit. 530(7) |

FIG. 6

| |
|---|
| Detecting erroneous flash memory cells that are flash memory cells that are associated with read errors that can not be corrected by the error evaluation circuit, and associating with read results of the erroneous flash memory cells a lower weight than a weight associated with flash memory cells that differ from the erroneous flash memory cells. 530(8) |
| Determining forbidden combinations of values of next read thresholds and wherein the wherein the determining of the multiple read threshold changes may include preventing the set of the next read threshold to comprise any forbidden combination of values. 530(9) |
| Applying a Kalman filter on the current read error direction statistics and on old read errors direction statistics associated with multiple previously obtained read results. 530(10) |
| Finding a set of optimal read thresholds. 530(11) |
| Finding an optimal read threshold that is located between a pair of voltage read threshold lobes by ignoring voltage read threshold voltages that are associated with less than a predetermined number of flash memory cells. 530(12) |
| Finding an optimal read threshold that is located between a pair of voltage read threshold lobes by finding extremum error read threshold values that one applied will result in a maximal number of read threshold correctable by the error evaluation circuit and calculating the optimal read threshold in response to the extremum error read threshold. 530(13) |
| Determining the multiple read threshold changes in response to optimal and sub-optimal read thresholds. 530(14) |

FIG. 7

DETERMINING READ THRESHOLDS BASED UPON READ ERROR DIRECTION STATISTICS

BACKGROUND OF THE INVENTION

NAND Flash devices store information as charge in a NAND Flash cell. Multi-level (MLC) NAND flash devices store k bits per cell using $2^k$ levels of charge. The amount of charge depends on the sequence of k bits being stored. For a certain sequence of k bits, the charge being stored may be distributed within a small range.

FIG. 1 shows an example of a read threshold voltage distribution of 3 bits per cell (bpc) MLC device, the read threshold voltage (voltage level) distribution has eight possible charge distributions (lobes) 11-18. As long as the charge distribution lobes are sufficiently distinct, the cell may be reliably read by using seven read thresholds 21-27.

The voltage level distributions of FIG. 1 illustrates non-overlapping lobes, however this is only schematic, and in practical cases the lobes may overlap. The reason for overlapping may be intentional for obtaining high programming speed, or due to the retention effect. For floating gate devices, an "old" page, may introduce greater overlap between lobes than a new page, since after many program/erase (P/E) cycles there is accumulated trap charge, which is de-trapped over time. After a long duration, every lobe may have a larger standard deviation (std) and may have a different mean location. These effects are also known as retention.

Overlap may also occur irrespective of retention. The Flash cells may deteriorate following P/E cycles and the write operation may become less accurate as a result.

The 3 bpc cell includes a most significant bit (MSB), a central significant bit (CSB) and a least significant bit (LSB). A physical page of flash memory module may store three logical pages. This physical page is programmed one logical page after the other. The programming includes various types of programming such as MSB programming (in which some of the cells are programmed to a single lobe and some are left in the erase state. At the end of this programming process only two lobes exists, the erase and the MSB lobes), a CSB programming (in which the erase lobe and the MSB lobe are each split into two lobes by further programming pulses, depending on the original state of each cell and the corresponding CSB bit. At the end of this step there are four lobes) and an LSB programming (in which each of the four lobes is further split to create 8 lobes, overall). The logical pages are read by applying various types of read operations such as MSB read (in which a MSB read threshold is used), CSB read (in which two CSB read thresholds are used) and LSB read (in which four LSB read thresholds are used). FIG. 2 shows similar distributions for the case of 2 bpc devices—the read threshold voltage distribution includes erase lobe 201 and three additional lobes 202-203 that can be read by using read thresholds 211-213. lobes 2.

As mentioned, the lobe distributions are not constant throughout the life of the flash and change with retention and program erase (P/E) cycles. With retention, the distributions become wider and shift towards the erase level. The higher the retention the larger the shift. This effectively shrinks the effective working window. Both the shrinkage of the window and the fattening of the distributions contribute to the increase in number of errors after performing a page read. FIG. 3 illustrates these effects. Just after being programmed the read threshold voltage distribution has eight non-overlapping lobes 111-118 that can be read by read thresholds 121-127 while following retention the read threshold voltage distribution has eight partially overlapping lobes 311-318 that differ from non-overlapping lobes 111-118. Read thresholds 321-327 can be applied when reading lone 311-318 but the number of read errors may exceed error correction coding capabilities.

These effects become significantly worse as the block P/E cycles increase and as the NAND Flash memory technology node shrinks.

The implications of the retention effect is that using the same set of read-read thresholds just following a programming operation and then following retention time may contribute to the number of read errors. In fact, it may be impossible to find a satisfactory set of such read-read thresholds. It is therefore crucial to optimally adjust the read threshold positions to minimize the number of errors.

Typically, a NAND flash controller contains an (Error Correction Code) ECC module so that a relatively small amount of errors due to lobes overlapping and/or due to using sub-optimal read thresholds can be corrected and the data written on the flash can be read. The decoder module which implements the ECC can also say which bits had errors, and whether these errors were of bits which originally had the value '1' but were read as '0' or the other way around.

SUMMARY

According to an embodiment of the invention a method may be provided and may include performing any of the stages described in the specification and/or claimed in the claims.

Further embodiments of the invention include a computer readable medium that is non-transitory and may store instructions for performing the above-described methods and any steps thereof, including any combinations of same. Additional embodiments of the invention include a system arranged to execute any or all of the methods described above, including any stages—and any combinations of same.

According to an embodiment of the invention there may be provided a method for setting read thresholds to be used for reading multiple bits per cell flash memory cells, the method may include reading, by a read circuit, the flash memory cells using a set of current read thresholds to provide current read results; finding, by an error evaluation circuit, current read errors direction statistics associated with the current read results; determining multiple read threshold changes based upon the current read error direction statistics, without determining a contribution of each current read threshold to the current read error direction statistics; and altering multiple current read thresholds, by the multiple read threshold updates, to provide a set of next read thresholds.

The method may include receiving or calculating old read errors direction statistics associated with multiple previously obtained read results, and wherein the determining is further responsive to the old read error direction statistics.

Each of the multiple read threshold changes may not exceed a smallest change amount allowable by the read circuit.

The determining of the multiple read threshold changes may include determining, for each current read threshold a read threshold change.

The method may include determining a read threshold change associated with a current read threshold in response to a value of the current read threshold and in response to the current read errors direction statistics, wherein the current read errors direction statistics comprise a number of current read errors along a first direction and a number of current read errors along an second direction opposite to the first direction.

The read threshold change may be a linear combination of the value of the current read threshold, the number of current read errors along the first direction and the number of current read errors along the second direction.

The determining of the multiple read threshold changes may be further responsive to at least one physical characteristic of the flash memory cells.

The determining of the multiple read threshold changes may include finding a maximal margin estimator to the set of next read thresholds.

The finding of the maximal margin estimator may include finding a minimum of an square absolute value of a difference between (i) a first vector of a set of optimal read thresholds, and (ii) a second vector that equals a multiplication of a read threshold and error matrix by a set of multiple read threshold changes; wherein the read threshold and error matrix may include multiple rows, each row may include a set of read thresholds applied during a read attempt of the group of flash memory cells and read error direction statistics associated with the read attempt.

The finding of the maximal margin estimator may include finding minimal and maximal sets of multiple read threshold changes that are associated with read error numbers that are amendable by the error evaluation circuit.

The method may include detecting erroneous flash memory cells that are flash memory cells that are associated with read errors that can not be corrected by the error evaluation circuit, and associating with read results of the erroneous flash memory cells a lower weight than a weight associated with flash memory cells that differ from the erroneous flash memory cells.

The method may include determining forbidden combinations of values of next read thresholds and wherein the determining of the multiple read threshold changes may include preventing the set of the next read threshold to comprise any forbidden combination of values.

the determining of the multiple read threshold changes may include applying a Kalman filter on the current read error direction statistics and on old read errors direction statistics associated with multiple previously obtained read results.

The method may include finding a set of optimal read thresholds.

The method may include finding an optimal read threshold that is located between a pair of voltage read threshold lobes by ignoring voltage read threshold voltages that are associated with less than a predetermined number of flash memory cells.

The method may include finding an optimal read threshold that is located between a pair of voltage read threshold lobes by finding extremum read threshold values that once applied will result in a maximal number of errors correctable by the error evaluation circuit and calculating the optimal read threshold in response to the extremum read thresholds.

The method may include determining the multiple read threshold changes in response to optimal and sub-optimal read thresholds.

A non-transitory computer readable medium that stores instructions to be executed by a computer for: reading, by a read circuit, flash memory cells using a set of current read thresholds to provide current read results; finding, by an error evaluation circuit, current read errors direction statistics associated with the current read results; determining multiple read threshold changes, by a read threshold circuit, based upon the current read error direction statistics, without determining a contribution of each current read threshold to the current read error direction statistics; and altering multiple current read thresholds by the multiple read threshold updates, to provide a set of next read thresholds.

The non-transitory computer readable medium may store instructions for receiving or calculating old read errors direction statistics associated with multiple previously obtained read results, and wherein the determining may be further responsive to the old read error direction statistics.

Each of the multiple read threshold changes may not exceed a smallest change amount allowable by the read circuit.

The determining of the multiple read threshold changes may include determining, for each current read threshold a read threshold change.

The non-transitory computer readable medium may store instructions for determining a read threshold change associated with a current read threshold in response to a value of the current read threshold and in response to the current read errors direction statistics, wherein the current read errors direction statistics comprise a number of current read errors along a first direction and a number of current read errors along an second direction opposite to the first direction.

The read threshold change may be a linear combination of the value of the current read threshold, the number of current read errors along the first direction and the number of current read errors along the second direction.

The determining of the multiple read threshold changes may be further responsive to at least one physical characteristic of the flash memory cells.

The determining of the multiple read threshold changes may include finding a maximal margin estimator to the set of next read thresholds.

The finding of the maximal margin estimator may include finding a minimum of an square absolute value of a difference between (i) a first vector of a set of optimal read thresholds, and (ii) a second vector that equals a multiplication of a read threshold and error matrix by a set of multiple read threshold changes; wherein the read threshold and error matrix may include multiple rows, each row may include a set of read thresholds applied during a read attempt of the group of flash memory cells and read error direction statistics associated with the read attempt.

The finding of the maximal margin estimator may include finding minimal and maximal sets of multiple read threshold changes that are associated with read error numbers that are amendable by the error evaluation circuit.

The non-transitory computer readable medium may store instructions for detecting erroneous flash memory cells that are flash memory cells that are associated with read errors that can not be corrected by the error evaluation circuit, and associating with read results of the erroneous flash memory cells a lower weight than a weight associated with flash memory cells that differ from the erroneous flash memory cells.

The non-transitory computer readable medium may store instructions for determining forbidden combinations of values of next read thresholds and wherein the determining of the multiple read threshold changes may include preventing the set of the next read threshold to comprise any forbidden combination of values.

The determining of the multiple read threshold changes may include applying a Kalman filter on the current read error direction statistics and on old read errors direction statistics associated with multiple previously obtained read results.

The non-transitory computer readable medium may store instructions for finding a set of optimal read thresholds.

The non-transitory computer readable medium may store instructions for finding an optimal read threshold that is located between a pair of voltage read threshold lobes by ignoring voltage read threshold voltages that are associated with less than a predetermined number of flash memory cells.

The non-transitory computer readable medium may store instructions for finding an optimal read threshold that is located between a pair of voltage read threshold lobes by finding extremum read threshold values that once applied will result in a maximal number of errors correctable by the error evaluation circuit and calculating the optimal read threshold in response to the extremum read thresholds.

The non-transitory computer readable medium may store instructions for determining the multiple read threshold changes in response to optimal and sub-optimal read thresholds.

According to an embodiment of the invention there may be provided a flash memory controller that may include a read circuit that is arranged to read flash memory cells using a set of current read thresholds to provide current read results; an error evaluation circuit that is arranged to find current read errors direction statistics associated with the current read results; a read threshold calculator that is arranged to determine multiple read threshold changes based upon the current read error direction statistics, without determining a contribution of each current read threshold to the current read error direction statistics; and wherein the flash memory controller is arranged to alter multiple current read thresholds, by the multiple read threshold updates, to provide a set of next read thresholds.

The flash memory controller can be arranged to execute any of the method stages listed above.

According to an embodiment of the invention there may be provided a method for setting read thresholds to be used for reading multiple bits per cell flash memory cells, the method may include: reading, by a read circuit, the flash memory cells, using a first set of read thresholds to provide first read results; finding, by an error evaluation circuit, a dominant direction of read errors associated with the read results; and altering multiple read thresholds of the first set of read thresholds to provide a second set of read thresholds, wherein he altering is expected to weaken a dominancy of the dominant direction of the read errors.

According to an embodiment of the invention there may be provided a non-transitory computer readable medium that stores instructions to be executed by a computer for: reading, by a read circuit, the flash memory cells, using a first set of read thresholds to provide first read results; finding, by an error evaluation circuit, a dominant direction of read errors associated with the read results; and altering multiple read thresholds of the first set of read thresholds to provide a second set of read thresholds, wherein he altering is expected to weaken a dominancy of the dominant direction of the read errors.

According to an embodiment of the invention there may be provided a flash memory controller, may include: a read circuit for reading the flash memory cells, using a first set of read thresholds to provide first read results; an error evaluation circuit for evaluating a dominant direction of read errors associated with the read results; and an read threshold circuit for altering multiple read thresholds of the first set of read thresholds to provide a second set of read thresholds, wherein he altering is expected to weaken a dominancy of the dominant direction of the read errors. For simplicity of explanation the read threshold circuit is not shown but can be easily added to FIG. 8.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIGS. 6 and 7 illustrate various stages of the method according to an embodiment of the invention.

Figure 1:
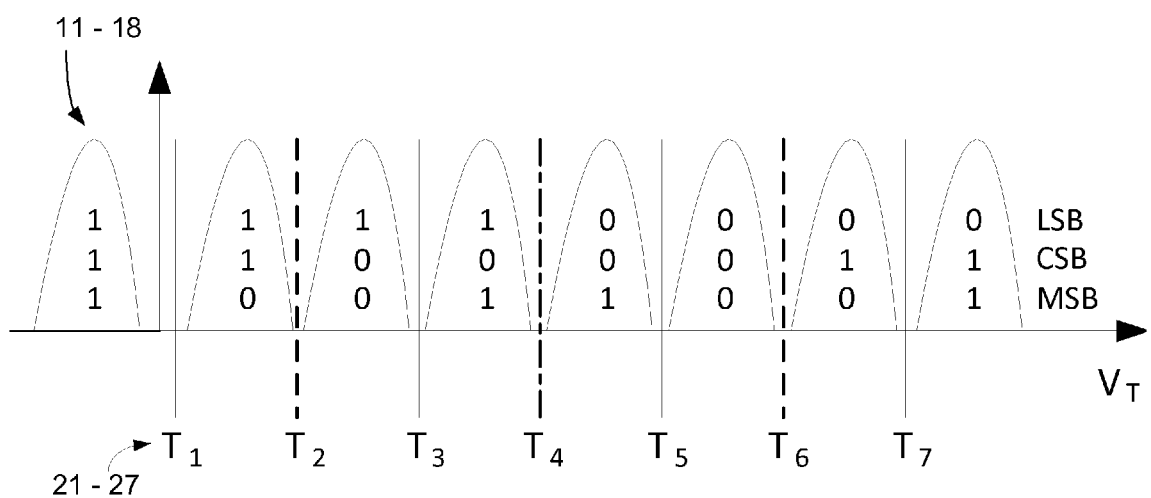
FIG. 1 illustrates a prior art read threshold voltage distribution.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE DRAWINGS

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a system capable of executing the method and should be applied mutatis mutandis to a non-transitory computer readable medium that stores instructions that once executed by a computer result in the execution of the method.

Any reference in the specification to a system should be applied mutatis mutandis to a method that can be executed by the system and should be applied mutatis mutandis to a non-transitory computer readable medium that stores instructions that can be executed by the system.

Any reference in the specification to a non-transitory computer readable medium should be applied mutatis mutandis to a system capable of executing the instructions stored in the non-transitory computer readable medium and should be applied mutatis mutandis to method that can be executed by a computer that reads the instructions stored in the non-transitory computer readable medium.

The term error may refer to a read error.

The term cell may refer to a flash memory cell.

A direction of read errors refers to a tendency to read one value as a second value. For example, a first direction of read errors can represent reading a zero bit as one or vice versa and a second direction of read errors can represent reading a one bit as zero or vice versa. Read errors of different directions can be also referred to read errors of different types.

The term read error direction statistics may refer to statistical information representing the number of read errors of one or more direction. For example, the read error direction statistics can include at least one of the number of read errors of the first direction, a number of read errors of a second direction, a difference between the numbers of read errors of different directions and the like.

A flash memory controller and especially a read circuit can define a limitation on the manner in which read thresholds can be altered. One limitation can be the smaller amount of change that can be applied. This amount can be referred to as the smallest possible amount. It is noted that any read threshold can be changed by more than the smallest possible amount.

According to various embodiments of the invention there is provided a method, a non-transitory computer readable medium and a system (or a flash memory controller for updating the read thresholds for a NAND Flash device without performing additional read operations other than those required to read the requested data. Thus—the calculating of next read threshold can be done without performing read attempts that are dedicated to evaluate the separate contribution of each read thresholds to the read errors. Such additional reads may be time consuming and may deteriorate the flash cells similarly to the P/E cycles effect.

There may be provided a method for correcting the read thresholds based on outputs of an error evaluation circuit such as an error correction decoder. As long as the decoder is successful, i.e., the read thresholds are not very far from the optimal read thresholds and the overlap between the lobes is reasonable, this read thresholds correction operation does not require any additional flash read commands, thus keeping the reading speed at maximum.

Read Threshold Circuit

There may be provided a system that may include a read threshold circuit. It can apply a tracking function for determining read thresholds. The read threshold circuit can be arranged to:

a. Update read thresholds based on their original values and/or several additional characteristics which will be detailed below along with the number of read errors they caused when reading a set of flash cells and their types.

Calculate or receive a set of next read thresholds for reading the next set of flash memory cells. The next and current read thresholds can be optimal or sub-optimal.

The read threshold circuit can find a tracking function (for finding the next read thresholds) which will, on average, give the best read thresholds upon receiving any possible set of original read thresholds and the read errors they caused. This can be done by training the tracking estimator.

The read threshold circuit may take advantage of the correlation between the read thresholds used and their distance from optimal read thresholds and the number and type of read errors detected in the set of cells which were read.

For instance, if the read threshold circuit is looking at SLC cells, the higher the read thresholds are above the optimal read thresholds, it will get more 0→1 errors, i.e., flash memory cells which were written with the value '1' are mistakably read as having the value '0' and vice versa.

In MLC cells the situation is more complex, since more 0→1 errors (zero value bits that are read as one) can emerge from mistakes in more than one read threshold and the directions of the movement may be opposite. For example, in CSB cells (MLC devices), more 0→1 errors may occur due to read threshold 1 being too high or read threshold 3 being too low. To this end we propose several possible estimators:

Smallest Step Tracking

In this tracking algorithm the read threshold circuit can use the difference between the number of 1→0 errors (one value bits that are read as zero) and 0→1 errors. The read threshold circuit can update the read thresholds differently based on the type of the flash memory cell which was read, but may change the read thresholds (for example) by the smallest possible amount.

MSB Cells

If there are more 0→1 errors than 1→0 errors—the read threshold circuit can decrease the read threshold by the smallest possible amount and vice versa.

CSB Cells

Two read thresholds take part in reading this type of cell, T1 and T3 (such as 211 and 213 of FIG. 2) as in the 2 bits per cell devices. If there are more 0→1 errors than 1→0 errors—the read threshold circuit can decrease T1 and decrease T3 by (for example) the smallest possible amount and vice versa.

LSB Cells of TLC Devices.

Four read thresholds are needed to read the LSB cells of a TLC device. They are denoted T1, T3, T5 and T7 (such as read thresholds 21, 23, 25 and 27 of FIG. 1). If there are more 0→1 errors than 1→0 errors—the read threshold circuit can decrease T1, increase T3, decrease T5 and increase T7 by the smallest possible amount and vice versa.

Figure 4:
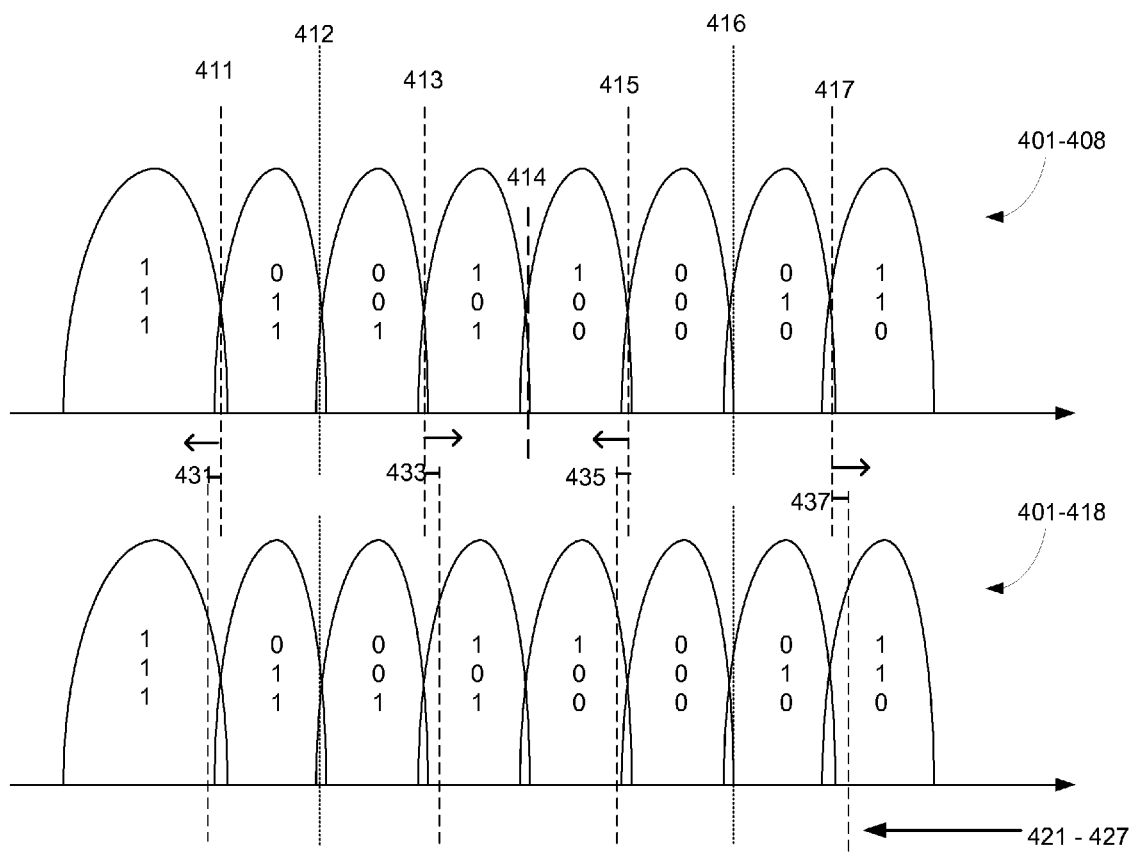
FIG. 4 illustrates various read threshold sets and differences according to various embodiments of the invention.

FIG. 4 illustrates a current threshold voltage distribution 400 having lobes 401-408, a set 410 of current read thresholds 411-417, a set 420 of next read thresholds 421-427 and read threshold changes 431, 433, 435 and 437 applied to current read thresholds 411, 413, 415 and 417 according to an embodiment of the invention.

It is assumed that there were much more 0→1 error than 1→0 error and current read thresholds 411 and 415 were decreased (by read threshold changes 431 and 435 respectively) while current read thresholds 413 and 417 were increased (by read threshold changes 433 and 437 respectively). The read threshold changes 431, 433, 435 and 437 can be limited to the smallest possible change but may exceed the smallest possible change. It is noted that the reach threshold changes may be equal for all read thresholds, may differ from one read threshold to another and may be the same for the same type of errors.

Higher Number of Bits Per Cell/Other Methods of Arranging the Lobes

In any other arrangement of the lobes or in any higher number of bits per cell this tracking method is easily adapted. If there are more 0→1 errors than 1→0 errors the read threshold circuit can move all read thresholds which affect the reading of the cells (for example, in CSB cells in TLC, T2 does not affect the read at all) by (for example) the smallest possible amount in the direction which will reduce the amount of 0→1 errors and vice versa.

Evidently, in non-MSB cells, some of the read thresholds may be updated to values closer to the optimal read thresholds, while other read thresholds may drift away from the optimal read thresholds, or all read thresholds may remain as close as they were to the optimal read thresholds. However, on average, it is expected to decrease in the total amount of errors and in the average distance of the read thresholds to the optimal read thresholds. In addition, the update is by the smallest possible amount, which is used in order to not overshoot the optimal read thresholds, but may make the tracking slow, in the sense that it would take reading of several sets of cells to reach close to the optimal read thresholds.

To overcome these disadvantages there may provided methods that apply at least one out of a single step tracking, a method that applies multi-step tracking, a method that applies a maximal margin (Max-Margin) estimator, a Kalman filter and the like.

Single Step Tracking

In this tracking algorithm the read threshold circuit can use an estimator function which will estimate the optimal change in read thresholds based on the following features:
  a. Number of cells read.
  b. Number of 1→0 errors.
  c. Number of 0→1 errors.
  d. The read thresholds used to read the set of cells.
  e. Physical properties of the cells, such as:
     i. Their position inside the flash/block/row.
     ii. The number of cycles these cells have gone through.
     iii. Their real and/or effective retention if available (for example—U.S. patent application Ser. No. 12/596,446 which is incorporated herein by reference).
     iv. The number of errors present when reading these cells using the optimal thresholds. In real time the read threshold circuit can estimate this parameter as the lowest number of errors obtained in the tracked block, assuming that, at least in some cell sets, tracking will be efficient enough to approximate the optimal read thresholds.

The read threshold circuit can train the estimator function on a large data set that may include all the features mentioned above and may perform perturbations on the optimal read thresholds, thus establishing the functional connection between these features and the correction it has to make to cancel out the perturbation and bring the read thresholds close to the optimal read thresholds.

The training procedure can estimate the best function using a Linear Minimum Mean Squared Error (LMMSE) estimator, a Minimum Mean Squared Error (MMSE) estimator or any other linear or non-linear estimation methods. The results of this offline estimation process can be saved and applied in real time on the input features. Since each bit (stored in a flash memory cell) may be read using a different set of read thresholds, the feature space and the estimated function may be different from one bit to another and may be trained and/or applied independently for each bit.

The inventors trained an LMMSE to estimate the appropriate shift in read thresholds for the 3 read thresholds of an MLC controller using the following features:
  a. Constant number of cells per read—138 Kb
  b. The read thresholds used to read the specific bit tracked in these cells.
  c. The number of 1→0 errors ($e_{1-0}$) and 0→1 errors ($e_{0-1}$) reported by the decoder for the specific bit (page) tracked.
  d. And the number 1s to allow the estimator to be biased in order to achieve lower MSE. The resulting tracking equations that indicate the read threshold difference for three read thresholds T1, T2 and T3 are presented below:

$$\Delta\hat{T}_2 = -3688e_{1\to0} + 213e_{0\to1} + T_2 + 188$$

$$\Delta\hat{T}_1 = 4012e_{1\to0} + 1265e_{0\to1} + T_1 + 521$$

$$\Delta\hat{T}_3 = 1273e_{1\to0} - 219e_{0\to1} + T_3 + 131$$

It is noted that this is just an example and other linear estimators can be provided. For example, assuming X1-X3, Y1-Y3 and C1-C3 are coefficients then:

$$\Delta\hat{T}_2 = -X2*e_{1\to0} + Y2*e_{0\to1} + T_2 + C2$$

$$\Delta\hat{T}_1 = X1*e_{1\to0} + Y1*e_{0\to1} + T_1 + C1$$

$$\Delta\hat{T}_3 = X3*3e_{1\to0} - Y3*e_{0\to1} + T_3 + C3$$

N Steps Tracking

In this tracking method the feature space which was described in the "single step tracking" section may be augmented by adding to it the input and output of the tracking when reading the previous N−1 sets of flash cells. The intuition behind this addition is to give the tracking estimator additional available information in order to assist it in approximating the optimal read thresholds. An intuitive example would be that if the tracking in the previous set of cells gave a bigger number of errors than the input set of read thresholds, then in the current step this overshoot may be fixed if enough information is available. Similarly to the method illustrated on in the "single step tracking" section the read threshold circuit may extract all the features offline on sets of cells where it is known the optimal read thresholds, apply estimation techniques to find the optimal function between the input features and the optimal needed shift in read thresholds, and then apply this function on the input features in real-time when reading the flash memory.

It should be noticed that during the first N−1 steps, this algorithm cannot be applied because it does not have enough input for the estimated function. This setback can be overcome by training all 1-Step, 2-Step, . . . , N-Step tracking methods and applying the best available for each set of cells, again increasing the memory demands.

Accordingly—there should be provided a tradeoff about the size of N-larger N values can provide more information but may be more time and resource consuming.

It is noted that even when N steps are available then the calculation of the read thresholds can be responsive only to a sub-set of sets.

The read threshold circuit can be fed with error direction statistics of each of N read attempts (sets), the read threshold used in each of the N read attempts.

Max-Margin Estimator

It was mentioned in the "single step tracking" section that any kind of estimator can be used to calculate the coefficients for updating the read thresholds based on the chosen features.

According to an embodiment of the invention the estimator can be a Max-Margin estimator.

The method may include:
calculating or receiving matrix {A} that is also referred to as a read threshold and error matrix, each row of the N rows of A may include read errors direction statistics and read thresholds associated with a certain read attempt, such as $e_{1-0}$, $e_{0-1}$, T1 . . . T7 calculating or receiving second vector {b} of evaluated read threshold changes—a change to be applied to each read threshold for each to achieve the corresponding optimal threshold, calculating or receiving a set {x} of read threshold changes Then linear least squares estimator is obtained by:

$$\hat{x} = \min_x \|Ax - b\|_2^2$$

The least squares solution may guarantee the minimal sum of square deviations from the optimal read thresholds.

It is noted that the Max-Margin estimator can be better fit to find the read thresholds as (a) a shift in read thresholds (measured in mV) cannot be linearly translated to number of reading errors and (b) the error evaluation circuit can correct up to a certain number of errors (with very high probability) so it doesn't really matter if we bring the read thresholds close enough to the optimal to have zero errors or this maximal number of errors, as long as we do not have more errors than the decoder can correct.

According to various embodiments of the invention instead of calculating the estimator based upon the set of optimal read threshold two sets of sub-optimal read thresholds can be found. For every row of A, i.e., for every set of measured features, find not only b, the optimal shift in the read threshold, but also $b_u$ and $b_l$, the highest and lowest possible values for the read threshold so that the number of errors is exactly the maximal number of errors the error evaluation circuit can correct. The optimization problem that the read threshold circuit should solve can have the following form:

$$\hat{x} = \max_x M$$
s.t.
$$Ax > b_l + M$$
$$Ax < b_u - M$$

This optimization may guarantees that for every set of input features the estimated shift in the read threshold will cause a correctable amount of errors. This optimization process can include solving a simple linear program (linear merit function with linear constraints) and can thus be solved relatively easily.

Impossible Sets of Cells (Erroneous Flash Memory Cells)

Some sets of cells may be impossible to decode, even with the optimal read threshold. They will have their component of $b_l > b_u$ causing the optimization cost function, M, to be negative.

The first way to cope with impossible sets of cells is simply to discard their components from A and from b, $b_l$, $b_u$ so that they do not contaminate the optimization for the other sets of cells.

An alternative way is to incorporate these sets of cells in the optimization but allow them to have negative margin using slack variables. The optimization then becomes:

$$\hat{x} = \max_x M - \sum \rho - \sum \sigma$$
s.t.
$$Ax > b_l + M - \rho$$
$$Ax < b_u - M + \sigma$$
$$\rho \geq 0$$
$$\sigma \geq 0$$

Accordingly—some sets of flash memory cells may be with negative margin, but their number and magnitude should be small because they decrease the merit value.

Bits with More than One Read Threshold

Finding $b_l$ and $b_u$ is simple when reading the bit consists of a single read threshold, but when several read thresholds are used to read a single bit (in MLC devices), the sum of errors for each read threshold makes up the number of errors for that bit. We propose to find $b_l$ and $b_u$ in the following manner.

Suppose T read thresholds are needed to read the bit. First the read threshold circuit may find for each read threshold the values for which it gives the maximal number of errors, provided that the other T−1 read thresholds are at their optimal values. This provides 2T points.

The read threshold circuit can add to them any number of additional combinations of read thresholds which give the maximal number of errors. Now the read threshold circuit may construct a T dimensional convex shape from these points in T-dimensions. Any convex shape can be used to approximate the set of all possible combinations of the read thresholds to which give the maximum correctable number of errors.

The read threshold circuit can use a T dimensional sphere. All the measured max-errors points must lie outside this sphere. The sphere is different for each set of cells, since each set of cells has its own optimal read thresholds and errors due to read threshold errors. The optimization problem then becomes:

$$\hat{x} = \max_x M$$
s.t.
$$\|A_i x - c_i\|_2 < M, i = 1, \ldots, N$$
$$\|p_i^j - c_i\|_2 > M, i = 1, \ldots, N, j = 1, \ldots, N_p(i)$$

Where $A_i$ is the i-th row of the features matrix A, $p_i^j$ is the j-th point of maximum number of errors for the set of cells described by the features $A_i$, and there are $N_p(i)$ such points, $N_p(i) \geq 2T$. The optimization chooses a center for these points denoted by $c_i$. The resulting optimization problem is a quadratic program, since the merit function is linear and the constraints are quadratic. It is feasible to solve this problem using many available numerical solvers.

This quadratic problem can also be augmented with positive slack variables to allow some of the points $p_i^j$ to be inside the sphere, but taking a price from the merit function.

$$\hat{x} = \max_{x} M - \sum \rho$$

s.t.

$\|A_i x - c_i\|_2 < M + \rho, i = 1, \ldots, N$ $\|p_i^j - c_i\|_2 > M, i = 1, \ldots, N, j = 1, \ldots, N_p(i)$ $\rho \geq 0$ Kalman-Filter Tracking According to various embodiment of the invention the read threshold circuit can use a Kalman filter, which can be required to remember the current state vector and its covariance matrix in order to determine the set of next read thresholds The read threshold circuit can construct the Kalman filter in the following manner:

The state vector consists of the N current read threshold values for the tracked bit, the estimated (unknown) read threshold offsets from the optimal read thresholds and 1:

$$x_k = [T^1, \ldots, T^N, \Delta T^1, \ldots, \Delta T^N, 1]^T$$

It is assumed that the state evolution is trivial (no drift in read thresholds due to change of row):

$$F = I_{2N+1}$$

It is noted that other types of state evolution are possible if one can predict the change of read thresholds between sets of cells. In that case $F \neq I$ and can be dependent on the position of set of cells inside the flash block.

The control signal $u_k$ changes both the read thresholds and the read threshold offsets. The read threshold circuit can use the state vector as the control vector, thus:

$$B = \begin{bmatrix} -I_N & 0_{N \times (N+1)} \\ -I_N & 0_{N \times (N+1)} \\ 0_{1 \times N} & 0_{1 \times (N+1)} \end{bmatrix}$$

And the state evolution equation i $$x_{k+1} = x_k + Bu_k + w_k$$

The control signal may be used simply to drive the thresholds to the currently estimated optimal thresholds, in which case it is calculated as follows:

$$u_k = \hat{x}_{k|k}$$

Furthermore, the control signal may be used to add online information to the system in case we have additional knowledge about the thresholds from external sources, such as other algorithms activated by the controller or any other information available to the controller online, which was not known offline (all the offline information was incorporated in F).

Where $w_k$ is the process noise which is assumed to be drawn from a zero mean multivariate normal distribution with covariance Q.

The read threshold circuit can estimate the values of the covariance matrix Q by measuring the expected variance between the optimal read thresholds of consecutive sets of cells. If the read threshold circuit expects a change and $F \neq I$ then Q is the covariance between the consecutive read thresholds after deducting the expected change.

The measurements are the numbers of 1→0 and 0→1 errors:

$$z_k = [e_{1 \to 0}, e_{0 \to 1}]^T$$

They are related to the state vector by a linear model:

$$z_k = H x_k + v_k$$

Where $v_k$ is the observation noise which is assumed to be zero mean Gaussian white noise with covariance R, and H was learned from the database, similarly to the usual training, as described in the "single step tracking" section, where the errors are the output and the rest of the features are the input and we are looking for the LMMSE to model the correlation between the input and the output:

$$H = \min_{H'} \|H'[\Delta T_1, \ldots, \Delta T_N, T_1, \ldots, T_N, 1, \text{additional features}]^T - [e_{1 \to 0}, e_{0 \to 1}]^T\|^2$$

Wherein the "additional features" may represent one or more physical properties of the flash memory cells, and may include one or more of the elements mentioned in the "single step tracking" section, there are N read thresholds T1-TN, and changes in the n'th read threshold is denoted ΔTn.

The covariance matrix R can be estimated by measuring the covariance of this model, i.e., the covariance between the vector of features times H and the actual number of errors.

From here the standard Kalman filter equations follow:

$$\hat{x}_{k|k-1} = F\hat{x}_{k-1|k-1} + Bu_k$$

$$P_{k|k-1} = P_{k-1|k-1} + Q$$

$$\tilde{y} = z_k - H\hat{x}_{k|k-1}$$

$$K_k = P_{k|k-1} H^T (H P_{k|k-1} H^T + R)^{-1}$$

$$\hat{x}_{k|k} = \hat{x}_{k|k-1} + K_k \tilde{y}$$

$$P_{k|k} = (I - K_k H) P_{k|k-1}$$

Wherein k−1|k−1 is a best read threshold estimate the read threshold circuit had in the previous iteration, k|k−1 is the best estimate using the previous estimate and the state evolution, and k|k is the best estimate in the current iteration including the state evolution and the new measurements in iteration k. $K_k$ is the Kalman gain used to multiply the error between the prediction and measurement. P is the estimated covariance of the state estimate, which expresses the certainty of the algorithm of its own estimation and is inversely proportional the weight given to new measurements. The algorithm is executed recursively, beginning from an initial guess $x_{0|0}$ and $P_{0|0}$ and implementing the Kalman equations upon every new measurement.

Expansions of the Kalman filter can also be used in tracking, such as the unscented Kalman filter (UKF) which can use a non-linear model between the input features and the output number of errors measured.

Regularizing the Estimator Input

When training the tracking estimator (relevant for all types of tracking presented above) it is important that the input to the estimator (taken from an offline database of cells with known optimal read thresholds) is regular. The adversary to this demand is the following phenomenon. Especially in devices before retention (and low number of P/E cycles) but not only there, there is sometimes no overlap or very small overlap between the lobes. Basically this is good, since a wide range of read thresholds gives results close to those of the optimal read threshold. However, this may be destructive for the estimator, since the actual optimal read thresholds for every such set of cells are actually random in the range between the lobes (affected by a single or a small number of cells with voltage levels between the main lobes).

Using the optimal read thresholds to train the estimator is thus problematic, since this artificial variance of the optimal read thresholds may be large and may distract the estimator from learning the true correlation between the optimal read thresholds and the other features.

In order to regularize the optimal read thresholds at least one of the following methods can be executed:

Ignoring a Small Number of Distracting Cells

Figure 2:
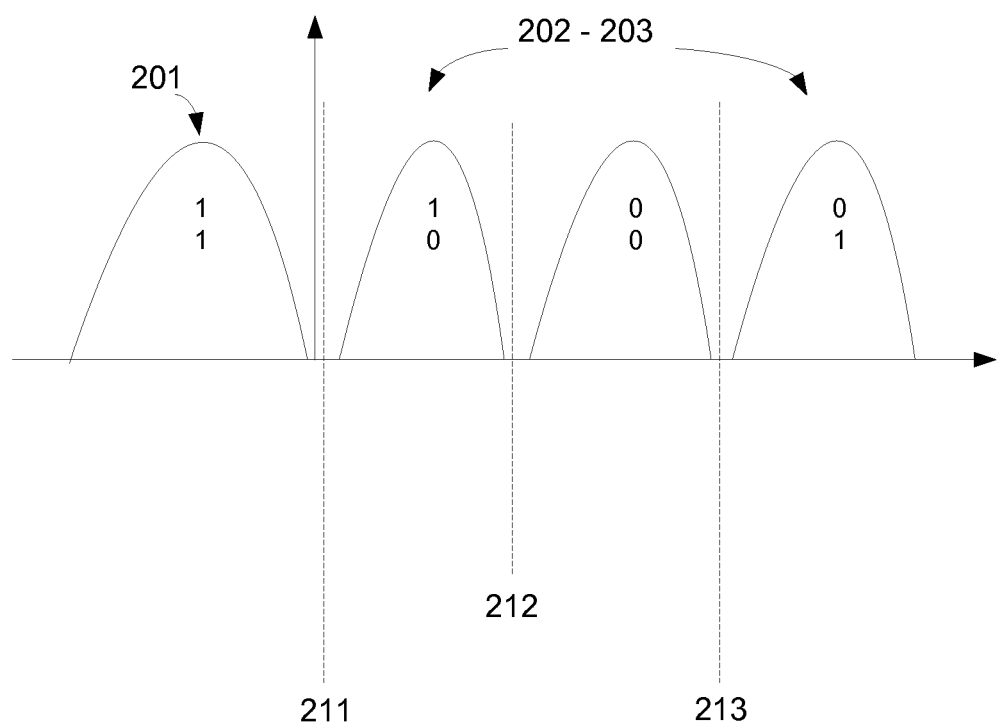
FIG. 2 illustrates a prior art read threshold voltage distribution.
Figure 3:
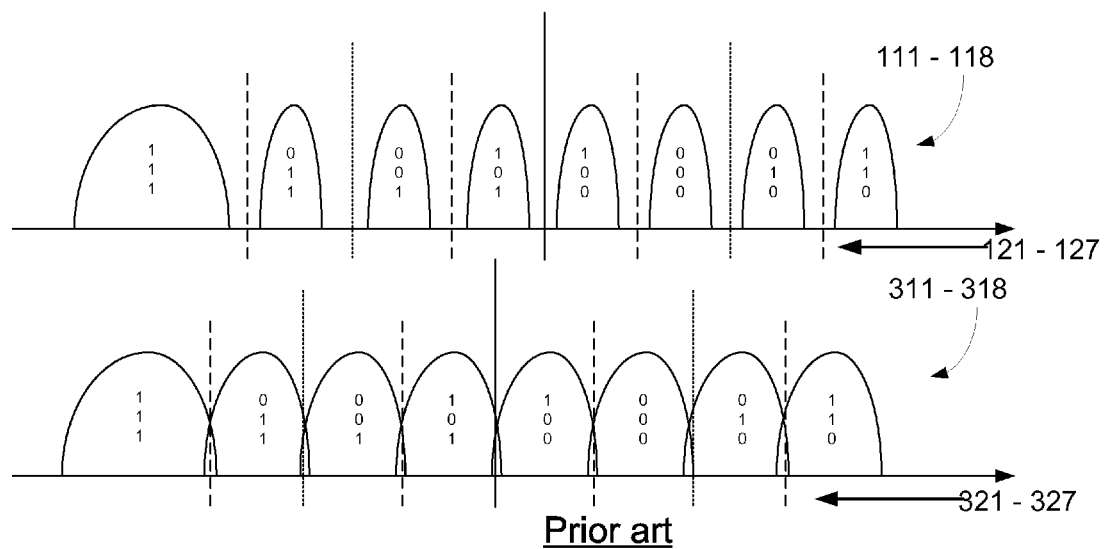
FIG. 3 illustrates prior art read threshold voltage distributions.

The read threshold circuit examines a single read threshold T to identify cells which have higher or lower voltage levels. The read threshold circuit assumes the cells were written so that half have higher levels and half have lower levels. Let there be M cells for which the read threshold circuit are looking for the optimal read thresholds. The read threshold circuit can plot the histogram of voltage levels of all the cells. Normally, the optimal read threshold is the read threshold above and below which there is an equal number of cells. The read threshold circuit can erase all the bins from this histogram which have a negligible number of cells with respect to M. This operation will leave only the two main lobes with a large number of cells in each voltage bin. The optimal read threshold will be chosen as the center between these lobes. This read threshold might not give the minimal number of errors possible, but it will give a very small number of errors (we erased only negligible bins) and will be much more repetitive when looking at many sets of cells. Referring, for example, to FIG. 2, the points between lobes 202 and 203 can be ignored and the optimal read threshold can be selected in an arbitrary manner.

Middle of an Acceptable Range

Since the flash controller contains an ECC module, it can handle a certain amount of errors. The fact of the matter is that we are not looking for the read thresholds which will give the lowest number of errors, but the read thresholds which will give a number of errors below a certain threshold, which allows correct decoding with very high probability. Accordingly, the read threshold circuit can examine the histogram from the previous paragraph and find the lower and upper read threshold values which cause exactly the maximum amount of errors the ECC module can deal with. The read threshold circuit can then select the average between these read thresholds as an optimal read threshold for training.

Weighted Least Squares

In the "single step tracking" section it was mentioned that many types of estimators can be used to train the tracking function. The read threshold circuit can apply the weighted least squares method. The reasoning is similar to that in the previous paragraph—the read threshold circuit needs read thresholds with low enough probability to lead to ECC failure. To this end the read threshold circuit can add points to the features-output data. For each set of input features the read threshold circuit can give as the desired result not only the optimal read threshold, but also a set of sub-optimal read thresholds, and give each such input-output set a weight inverse proportional to the number of errors obtained by using this read threshold (and not the square distance from the optimal read threshold which is the standard optimization in Least Squares).

Figure 5:
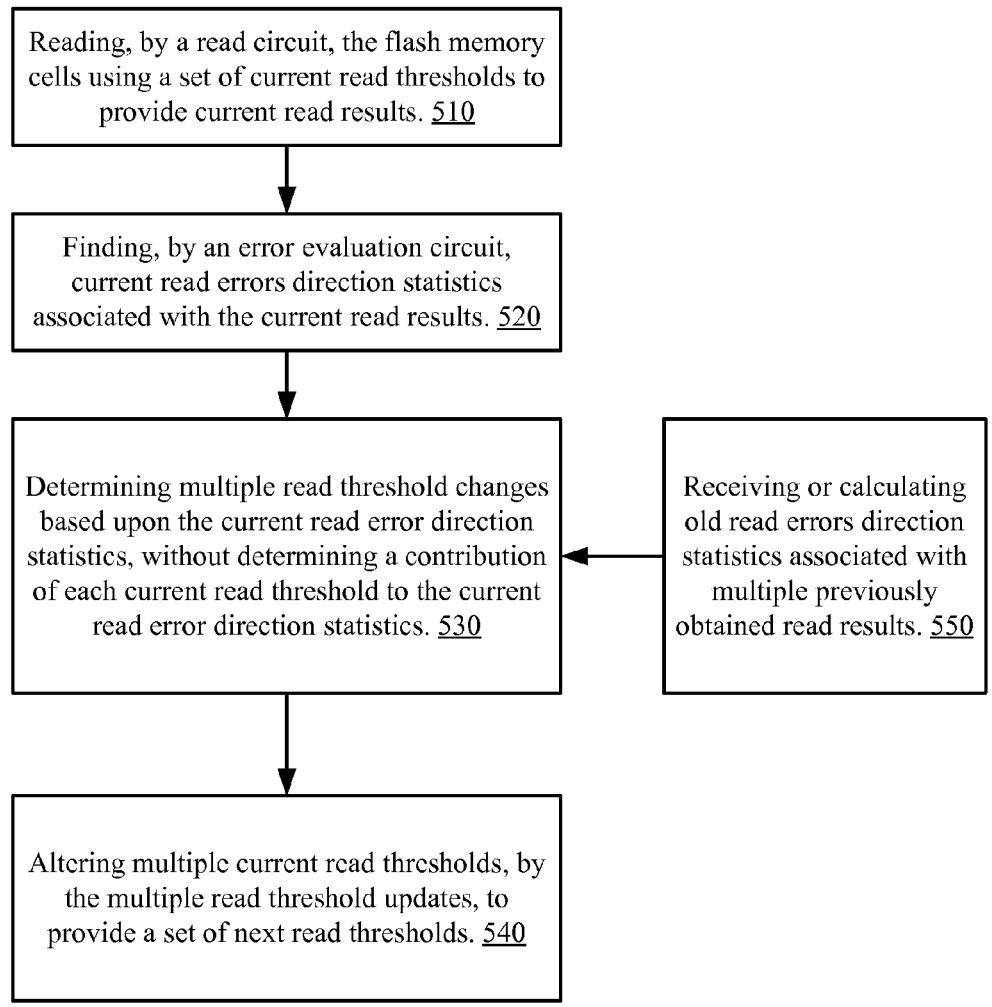
FIG. 5 illustrates a method according to an embodiment of the invention.

FIG. 5 illustrates method 500 according to an embodiment of the invention.

Method 500 can be used for setting read thresholds to be used for reading multiple bits per cell flash memory cells.

Method 500 can include stage 510 of reading, by a read circuit, the flash memory cells using a set of current read thresholds to provide current read results.

Stage 510 may be followed by stage 520 of finding, by an error evaluation circuit, current read errors direction statistics associated with the current read results.

Stage 520 may be followed by stage 530 determining multiple read threshold changes based upon the current read error direction statistics, without determining a contribution of each current read threshold to the current read error direction statistics.

Stage 530 may be followed by stage 540 altering multiple current read thresholds, by the multiple read threshold updates, to provide a set of next read thresholds.

Stage 540 may be followed by stage 510 wherein the set of next read thresholds is now the set of current read thresholds.

According to an embodiment of the invention method 500 can include stage 550 of receiving or calculating old read errors direction statistics associated with multiple previously obtained read results. Stage 550 may be followed of stage 530 during which the determining is further responsive to the old read error direction statistics.

Stage 540 may include changing each of the multiple read threshold changes does not exceed a smallest change amount allowable by the read circuit.

Stage 530 may include at least one out of stages a-m that are listed below and are denoted 530(1)-530(14) in FIGS. 6 and 7:

a. Determining, for each current read threshold a read threshold change.

b. Determining a read threshold change associated with a current read threshold in response to a value of the current read threshold and in response to the current read errors direction statistics, wherein the current read errors direction statistics comprise a number of current read errors along a first direction and a number of current read errors along an second direction opposite to the first direction.

c. Calculating a read threshold change as a linear combination of the value of the current read threshold, the number of current read errors along the first direction and the number of current read errors along the second direction. The coefficients of the linear combination can be learnt during a learning period but may be updated over time.

d. Determining of the multiple read threshold changes in response to at least one physical characteristic of the flash memory cells.

e. Finding a maximal margin estimator to the set of next read thresholds.

f. Finding of the maximal margin estimator by finding a minimum of a square absolute value of a difference between (i) a first vector of a set of optimal read thresholds, and (ii) a second vector that equals a multiplication of a read threshold and error matrix by a set of multiple read threshold changes; wherein the read threshold and error matrix may include multiple rows, each row may include a set of read thresholds applied during a read attempt of the group of flash memory cells and read error direction statistics associated with the read attempt. At least some of the elements involves in this calculation can be calculated in advance.

g. Finding the maximal margin estimator by finding minimal and maximal sets of multiple read threshold changes that are associated with read error numbers that are amendable by the error evaluation circuit h. Detecting erroneous flash memory cells, i.e., flash memory cells that are associated with read errors that cannot be corrected by the error evaluation circuit, and associating with read results of the erroneous flash memory cells a lower weight than a weight associated with the other, possible to read and correct, flash memory cells.

i. Determining forbidden combinations of values of next read thresholds and wherein the determining of the multiple read threshold changes may include preventing the set of the next read threshold to comprise any forbidden combination of values. This can be calculated off-line.

j. Applying a Kalman filter on the current read error direction statistics and on old read errors direction statistics associated with multiple previously obtained read results.

k. Finding a set of optimal read thresholds.

l. Finding an optimal read threshold that is located between a pair of voltage read threshold lobes by ignoring voltage read threshold voltages that are associated with less than a predetermined number of flash memory cells.

m. Finding an optimal read threshold that is located between a pair of voltage read threshold lobes by finding minimum and maximum read threshold values that once applied will result in a maximal number of read errors correctable by the error evaluation circuit and calculating the optimal read threshold as the average of these minimum and maximum read thresholds.

n. Determining the multiple read threshold changes in response to optimal and sub-optimal read thresholds.

Figure 8:
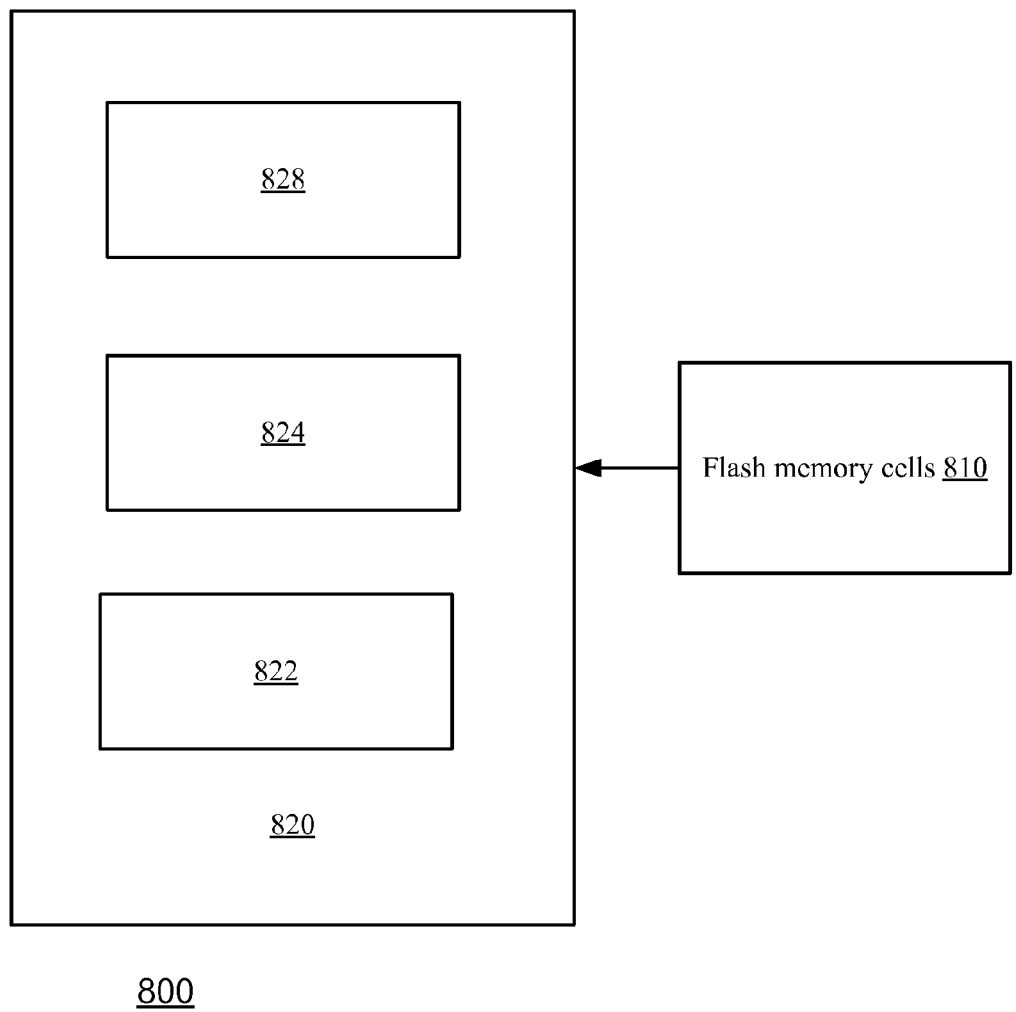
FIG. 8 illustrates a system according to an embodiment of the invention.

FIG. 8 illustrates a system 800 according to an embodiment of the invention.

System 800 includes flash memory cells 810 and a flash memory controller 820. The flash memory controller includes a read circuit 822, a read threshold circuit 824 and an error evaluation circuit 828.

The read circuit 828 may be arranged to read flash memory cells 810 using a set of current read thresholds to provide current read results.

The error evaluation circuit 828 can detect errors (by applying error correction decoding) and may even correct errors. It may be arranged to find current read errors direction statistics associated with the current read results.

The read threshold calculator 824 can belong to the read circuit 822 and may not belong to the read circuit. It may be arranged to determine multiple read threshold changes based upon the current read error direction statistics, without determining a contribution of each current read threshold to the current read error direction statistics.

The flash memory controller 820 (for example—the read circuit 822 or the read threshold circuit 824) may be arranged to alter multiple current read thresholds, by the multiple read threshold updates, to provide a set of next read thresholds.

The invention may also be implemented in a computer program for running on a computer system, at least including code portions for performing steps of a method according to the invention when run on a programmable apparatus, such as a computer system or enabling a programmable apparatus to perform functions of a device or system according to the invention.

A computer program is a list of instructions such as a particular application program and/or an operating system. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system.

The computer program may be stored internally on a non-transitory computer readable medium. All or some of the computer program may be provided on computer readable media permanently, removably or remotely coupled to an information processing system. The computer readable media may include, for example and without limitation, any number of the following: magnetic storage media including disk and tape storage media; optical storage media such as compact disk media (e.g., CD-ROM, CD-R, etc.) and digital video disk storage media; nonvolatile memory storage media including semiconductor-based memory units such as FLASH memory, EEPROM, EPROM, ROM; ferromagnetic digital memories; MRAM; volatile storage media including registers, buffers or caches, main memory, RAM, etc.

A computer process typically includes an executing (running) program or portion of a program, current program values and state information, and the resources used by the operating system to manage the execution of the process. An operating system (OS) is the software that manages the sharing of the resources of a computer and provides programmers with an interface used to access those resources. An operating system processes system data and user input, and responds by allocating and managing tasks and internal system resources as a service to users and programs of the system.

The computer system may for instance include at least one processing unit, associated memory and a number of input/output (I/O) devices. When executing the computer program, the computer system processes information according to the computer program and produces resultant output information via I/O devices.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

We claim:

1. A method for setting read thresholds to be used for reading multiple bits per cell flash memory cells, the method comprises:
   reading, by a read circuit, the flash memory cells using a set of current read thresholds to provide current read results;
   finding, by an error evaluation circuit, current read errors direction statistics associated with the current read results;
   determining multiple read threshold changes based upon the current read error direction statistics, without determining a contribution of each current read threshold to the current read error direction statistics; and
   altering multiple current read thresholds, by the multiple read threshold updates, to provide a set of next read thresholds;
   wherein at least one of the following is true:
   (i) the method further comprises receiving or calculating old read errors direction statistics associated with multiple previously obtained read results, and wherein the determining is further responsive to the old read error direction statistics;
   (ii) each of the multiple read threshold changes does not exceed a smallest change amount allowable by the read circuit;
   (iii) the determining of the multiple read threshold changes comprises determining, for each current read threshold, a read threshold change;
   (iv) the determining of the multiple read threshold changes is further responsive to at least one physical characteristic of the flash memory cells;
   (v) the determining of the multiple read threshold changes comprises finding a maximal margin estimator to the set of next read thresholds;
   (vi) the determining of the multiple read threshold changes comprises applying a Kalman filter on the current read error direction statistics and on old read errors direction statistics associated with multiple previously obtained read results;

(vii) the method further comprises finding a set of optimal read thresholds; and (viii) the determining the multiple read threshold changes is responsive to optimal and sub-optimal read thresholds.

2. The method according to claim 1, comprising receiving or calculating the old read errors direction statistics associated with the multiple previously obtained read results, and wherein the determining is further responsive to the old read error direction statistics.

3. The method according to claim 1, wherein each of the multiple read threshold changes does not exceed the smallest change amount allowable by the read circuit.

4. The method according to claim 1, wherein the determining of the multiple read threshold changes comprises determining, for each current read threshold the read threshold change.

5. The method according to claim 4, comprises determining a read threshold change associated with a current read threshold in response to a value of the current read threshold and in response to the current read errors direction statistics, wherein the current read errors direction statistics comprise a number of current read errors along a first direction and a number of current read errors along an second direction opposite to the first direction.

6. The method according to claim 4, wherein the read threshold change is a linear combination of the value of the current read threshold, the number of current read errors along the first direction and the number of current read errors along the second direction.

7. The method according to claim 1, wherein the determining of the multiple read threshold changes is further responsive to the at least one physical characteristic of the flash memory cells.

8. The method according to claim 1, wherein the determining of the multiple read threshold changes comprises finding the maximal margin estimator to the set of next read thresholds.

9. The method according to claim 8, wherein the finding of the maximal margin estimator comprises finding a minimum of an square absolute value of a difference between (i) a first vector of a set of optimal read thresholds, and (ii) a second vector that equals a multiplication of a read threshold and error matrix by a set of multiple read threshold changes; wherein the read threshold and error matrix comprises multiple rows, each row comprises a set of read thresholds applied during a read attempt of the group of flash memory cells and read error direction statistics associated with the read attempt.

10. The method according to claim 8, wherein the finding of the maximal margin estimator comprises finding minimal and maximal sets of multiple read threshold changes that are associated with read error numbers that are amendable by the error evaluation circuit.

11. The method according to claim 8, comprising detecting erroneous flash memory cells that are flash memory cells that are associated with read errors that can not be corrected by the error evaluation circuit, and associating with read results of the erroneous flash memory cells a lower weight than a weight associated with flash memory cells that differ from the erroneous flash memory cells.

12. The method according to claim 8, comprising determining forbidden combinations of values of next read thresholds and wherein the determining of the multiple read threshold changes comprises preventing the set of the next read threshold to comprise any forbidden combination of values.

13. The method according to claim 1, wherein the determining of the multiple read threshold changes comprises applying the Kalman filter on the current read error direction statistics and on the old read errors direction statistics associated with multiple previously obtained read results.

14. The method according to claim 1, comprising finding the set of optimal read thresholds.

15. The method according to claim 14, comprising finding an optimal read threshold that is located between a pair of voltage read threshold lobes by ignoring voltage read threshold voltages that are associated with less than a predetermined number of flash memory cells.

16. The method according to claim 14, comprising finding an optimal read threshold that is located between a pair of voltage read threshold lobes by finding extremum read threshold values that once applied will result in a maximal number of errors correctable by the error evaluation circuit and calculating the optimal read threshold in response to the extremum read thresholds.

17. The method according to claim 1 comprising determining the multiple read threshold changes in response to the optimal and sub-optimal read thresholds.

18. A non-transitory computer readable medium that stores instructions to be executed by a computer for:

reading, by a read circuit, flash memory cells using a set of current read thresholds to provide current read results;

finding, by an error evaluation circuit, current read errors direction statistics associated with the current read results;

determining multiple read threshold changes, by a read threshold circuit, based upon the current read error direction statistics, without determining a contribution of each current read threshold to the current read error direction statistics; and altering multiple current read thresholds by the multiple read threshold updates, to provide a set of next read thresholds;

wherein at least one of the following is true:

(i) the non-transitory computer readable medium further stores instructions for receiving or calculating old read errors direction statistics associated with multiple previously obtained read results, and wherein the determining is further responsive to the old read error direction statistics;

(ii) each of the multiple read threshold changes does not exceed a smallest change amount allowable by the read circuit;

(iii) the determining of the multiple read threshold changes comprises determining, for each current read threshold a read threshold change;

(iv) the determining of the multiple read threshold changes is further responsive to at least one physical characteristic of the flash memory cells;

(v) the determining of the multiple read threshold changes comprises finding a maximal margin estimator to the set of next read thresholds;

(vi) the determining of the multiple read threshold changes comprises applying a Kalman filter on the current read error direction statistics and on old read errors direction statistics associated with multiple previously obtained read results;

(vii) the non-transitory computer readable medium further stores instructions for finding a set of optimal read thresholds; and (viii) the non-transitory computer readable medium further stores instructions for determining the multiple read threshold changes in response to optimal and sub-optimal read thresholds.

19. The non-transitory computer readable medium according to claim 18, that stores instructions for receiving or calculating the old read errors direction statistics associated with the multiple previously obtained read results, and wherein the determining is further responsive to the old read error direction statistics.

20. The non-transitory computer readable medium according to claim 18, wherein each of the multiple read threshold changes does not exceed the smallest change amount allowable by the read circuit.

21. The non-transitory computer readable medium according to claim 18, wherein the determining of the multiple read threshold changes comprises determining, for each current read threshold, the read threshold change.

22. The non-transitory computer readable medium according to claim 21, comprises determining a read threshold change associated with a current read threshold in response to a value of the current read threshold and in response to the current read errors direction statistics, wherein the current read errors direction statistics comprise a number of current read errors along a first direction and a number of current read errors along an second direction opposite to the first direction.

23. The non-transitory computer readable medium according to claim 21, wherein the read threshold change is a linear combination of the value of the current read threshold, the number of current read errors along the first direction and the number of current read errors along the second direction.

24. The non-transitory computer readable medium according to claim 18, wherein the determining of the multiple read threshold changes is further responsive to the at least one physical characteristic of the flash memory cells.

25. The non-transitory computer readable medium according to claim 18, wherein the determining of the multiple read threshold changes comprises finding the maximal margin estimator to the set of next read thresholds.

26. The non-transitory computer readable medium according to claim 25, wherein the finding of the maximal margin estimator comprises finding a minimum of an square absolute value of a difference between (i) a first vector of a set of optimal read thresholds, and (ii) a second vector that equals a multiplication of a read threshold and error matrix by a set of multiple read threshold changes; wherein the read threshold and error matrix comprises multiple rows, each row comprises a set of read thresholds applied during a read attempt of the group of flash memory cells and read error direction statistics associated with the read attempt.

27. The non-transitory computer readable medium according to claim 25, wherein the finding of the maximal margin estimator comprises finding minimal and maximal sets of multiple read threshold changes that are associated with read error numbers that are amendable by the error evaluation circuit.

28. The non-transitory computer readable medium according to claim 25, that stores instructions for detecting erroneous flash memory cells that are flash memory cells that are associated with read errors that can not be corrected by the error evaluation circuit, and associating with read results of the erroneous flash memory cells a lower weight than a weight associated with flash memory cells that differ from the erroneous flash memory cells.

29. The non-transitory computer readable medium according to claim 25, that stores instructions for determining forbidden combinations of values of next read thresholds and wherein the determining of the multiple read threshold changes comprises preventing the set of the next read threshold to comprise any forbidden combination of values.

30. The non-transitory computer readable medium according to claim 18, wherein the determining of the multiple read threshold changes comprises applying the Kalman filter on the current read error direction statistics and on the old read errors direction statistics associated with the multiple previously obtained read results.

31. The non-transitory computer readable medium according to claim 18, that stores instructions for finding the set of optimal read thresholds.

32. The non-transitory computer readable medium according to claim 31, that stores instructions for finding an optimal read threshold that is located between a pair of voltage read threshold lobes by ignoring voltage read threshold voltages that are associated with less than a predetermined number of flash memory cells.

33. The non-transitory computer readable medium according to claim 31, that stores instructions for finding an optimal read threshold that is located between a pair of voltage read threshold lobes by finding extremum read threshold values that once applied will result in a maximal number of errors correctable by the error evaluation circuit and calculating the optimal read threshold in response to the extremum read thresholds.

34. The non-transitory computer readable medium according to claim 18, that stores instructions for determining the multiple read threshold changes in response to the optimal and sub-optimal read thresholds.

35. A flash memory controller, comprising:
  a read circuit that is arranged to read flash memory cells using a set of current read thresholds to provide current read results;
  an error evaluation circuit that is arranged to find current read errors direction statistics associated with the current read results;
  a read threshold calculator that is arranged to determine multiple read threshold changes based upon the current read error direction statistics, without determining a contribution of each current read threshold to the current read error direction statistics; and
  wherein the flash memory controller is arranged to alter multiple current read thresholds, by the multiple read threshold updates, to provide a set of next read thresholds;
  wherein at least one of the following is true:
  (i) the flash memory controller is further configured to receive or calculate old read errors direction statistics associated with multiple previously obtained read results, and wherein the read threshold calculator is configured to determine the multiple read threshold changes further in response to the old read error direction statistics;
  (ii) each of the multiple read threshold changes does not exceed a smallest change amount allowable by the read circuit;
  (iii) the read threshold calculator is configured to determine the multiple read threshold changes by determining, for each current read threshold, a read threshold change;
  (iv) the read threshold calculator is configured to determine the multiple read threshold changes by in further response to at least one physical characteristic of the flash memory cells;

(v) the read threshold calculator is configured to determine the multiple read threshold changes by finding a maximal margin estimator to the set of next read thresholds;
(vi) the read threshold calculator is configured to determine the multiple read threshold changes by applying a Kalman filter on the current read error direction statistics and on old read errors direction statistics associated with multiple previously obtained read results;
(vii) the flash memory controller is further configured to find a set of optimal read thresholds; and
(viii) the read threshold calculator is configured to determine the multiple read threshold changes in response to optimal and sub-optimal read thresholds.

* * * * *